(12) United States Patent
Hen

(10) Patent No.: US 6,621,223 B1
(45) Date of Patent: Sep. 16, 2003

(54) PACKAGE SOCKET AND PACKAGE LEGS STRUCTURE FOR LED AND MANUFACTURING OF THE SAME

(76) Inventor: Chang Hsiu Hen, No. 33, Alley 32, Lane 91, Hsuei-tien St., HsinChu (TW), 300

( * ) Notice: Subject to any disclaimer, the term of this patent is extended or adjusted under 35 U.S.C. 154(b) by 0 days.

(21) Appl. No.: 10/117,867

(22) Filed: Apr. 5, 2002

(51) Int. Cl.[7] .............................. H01J 13/46; H01J 1/62; H01L 33/00; H01L 27/14

(52) U.S. Cl. .................... 315/56; 315/185 S; 257/99; 257/98; 257/676; 257/670; 257/782; 362/800; 313/499

(58) Field of Search .................... 315/56, 58, 185 S, 315/363; 257/99, 98, 676, 670, 782, 88, 89, 784, 783; 362/380, 800, 241, 247; 313/499, 489, 500

(56) References Cited

U.S. PATENT DOCUMENTS

| | | | | |
|---|---|---|---|---|
| 5,218,233 A | * | 6/1993 | Takahashi | 257/787 |
| 5,289,082 A | * | 2/1994 | Komoto | 313/500 |
| 5,324,962 A | * | 6/1994 | Komoto et al. | 257/89 |
| 5,519,596 A | * | 5/1996 | Woolverton | 362/250 |
| 5,564,819 A | * | 10/1996 | Yamaguchi | 362/241 |
| 6,386,733 B1 | * | 5/2002 | Ohkohdo et al. | 362/249 |
| 6,486,543 B1 | * | 11/2002 | Sano et al. | 257/684 |

* cited by examiner

Primary Examiner—Don Wong
Assistant Examiner—Tuyet T. Vo
(74) Attorney, Agent, or Firm—Perkins Coie LLP

(57) ABSTRACT

The present invention discloses a structure of package socket and package legs for three-primary-color LED and the manufacturing method of this structure. One of the leg forms a die bonding seat and a common negative bonding pad, the other three legs form positive bonding pads. Said negative and positive bonding pads are arranged in the four corners of a square, with two legs stretch to the right, the other two legs stretch to the left. Then punch by a punch machine with a tooling to form an array of the structures, or by electrode plating or by etching to form the array. The four legs are then bending 90° to one side near the bonding pads such that it can stand alone. After die bond and wire bond has performed, the LED is sealed by transparent epoxy molding, and then cut to single structures, or the structure is cut to single structures before the LED is sealed by transparent epoxy. The other structure is by further bending the four legs near the end of the legs to satisfy surface mount technology (SMT).

10 Claims, 5 Drawing Sheets

PACKAGE SOCKET AND PACKAGE LEGS STRUCTURE FOR LED AND MANUFACTURING OF THE SAME

BACKGROUND OF THE INVENTION

1. Field of the Invention

The present invention related to light emitting diode (LED) packaging technology more particularly, to a package socket and package legs structure and manufacturing method for three-primary-color LED packaging.

2. Description of Relative Prior Art

The conventional mono-color LED package structure has two package legs, two-color LED has three package legs, and three-primary-color (red, blue and green) LED may have three or four package legs. FIG. 1 shows the cross sectional view of the package structure of a mono-color LED with two package legs. One of the package leg form the negative bond pad 3 has a socket to form a die seat 2, LED die 1 is die bonded on the die seat 2, the other package legs form the positive bond pad 4, the positive and negative electrode of the die is then wire bond to the positive and negative bond pad, respectively. Finally seal with transparent epoxy 8, which also form a round-shape focus lens. FIG. 2 shows the cross sectional view of a package structure of three-primary-color LED with four package legs 7. A common negative bond pad 3 has a socket to form a die seat 2, LED die 1 is die bonded on the die seat 2. The negative electrode of the die(the back side of the die) is then connected directly to the common negative bond pad 3, The positive pads of the red, blue and green LED is wire bonded to the red, blue and green positive R+ 5, B+ 4 and G+ 6, respectively. Finally seal with transparent epoxy 8, which also form a round-shape focus lens, The top view is shown in FIG. 3, wherein the die seat 2 is rectangular shape, the red, blue and green LED dice are arranged in perpendicular to the width of the package to decrease the width of the package. Again refer to FIG. 2, the four package legs is stretched from the seal for plugging into the hole of a PC board (not shown). Refer to FIG. 4, the manufacturing of this traditional three or four package legs structure is made by using a tooling and a punch machine to punch through a metal plate from the direction of the arrow A in FIG. 3 to form the negative bond pad 3, in the center, a socket form the die seat 2. Then punch from a direction perpendicular to the plane of the metal plate to form the package legs 4,5,6 and the small tie bar and large tie bar 57,55, as shown in FIG. 4. The structure is then cut to single structures 12 along lines 10–10' and 11–11' for die bond and wire bond. The width of every leg is at least 0.5 mm, the width of the negative or positive bond pad is 0.5 mm+0.2 mm+0.2 mm=0.9 mm, and the space between bond pads is at least 0.5 mm, so the space between two legs is not smaller than 0.5+2(0.9/2)+0.1=1.5 mm, where 0.1 mm is the tolerance. Four legs need 4×1.5=6 mm, which make the structure too wide and the epoxy seal is ellipsoid, as shown in FIG. 3. For smaller package, the space must be deceased so that the tooling is difficult to produce, and manufacturing is also difficult. The focus of the ellipsoid is not good enough. Also the width and space of the legs affect the drilling and plating of the hole on the pc board. The red, blue and green LED dice must be piled up perpendicular to the width of the package to reduce the total width, Also if we watch from the blue light side, the green light may not be seen, it is also true if we watch from the green light side. Recently a proposal put the three primary-color-LEDs in overlap cascaded. This cascaded structure is described in the U.S. Pat. No. 10/001,419 to Chang Hsiu Hen, names "Package Structure of Full Color LED Form by Overlap Cascaded Die Bound". The structure is shown in FIG. 8, wherein the red LED is on he bottom, which is made by epitaxy a pn junction on the opaque GaAs substrate 71, under the substrate 71 is the negative electrode of the red LED, the positive electrode 72 of the red LED is a reflective metal layer. The negative and positive electrode of the blue LED is the reflective metal layer 73 and 74 on the n-type and p-type semiconductor, the green LED is the same as the blue LED. The conductive layer of the LEDs is a transparent metal oxide (ITO, Indium Tin Oxide) so that the three color-lights can be emitted after mixed. However, This LED die can not use the traditional three-leg package structure. Using four-leg package structure will increase the width of the package, if decrease the width by decreasing the width and space between package legs will make the hole drilling on the PC board more difficult, and smaller hole diameter will make electrode plating not uniform.

SUMMARY OF THE INVENTION

The object of the present invention is to provide an LED packaging socket and package legs structure which can decrease the width of the package such that less PC board area is needed, hole drilling of the pc board is more easily and plating in the hole is more uniform, which gives a better contact, these make the manufacturing of LED array more easily.

Another object of the present invention is to provide an overlap cascaded packaging structure of a full color semiconductor LED with reflected metal layer to enhance the intensity of light.

Another object of the present invention is to provide an LED package socket and package legs structure that the LED package is round shape, the round-shape parabola side-wall of the socket reflect and focus the light then emit forward to increase the intensity, the surface of the transparent epoxy seal also form round-shape focus lens which will give better focus and imaging effect.

The other object of the present invention is to provide an LED package socket and package legs structure, which can be used in an multi-color overlap cascaded LED packaging, the length of the bonding wire can be decreased, so that reliability can be increased and wire resistant can be reduced.

The other object of the present invention is to provide a manufacturing method of LED package socket and package legs structure, wherein the four package legs can be stand along on the corner of a square and surface mount is possible, assembling is more easily and need not to drill holes in the PC board.

The other object of the present invention is to provide a manufacturing method of LED package socket and package legs structure, so that punching is operated in the same direction to decrease the difficulty of punch operation.

In order to achieve the above objects, the three-primary-color LED package structure with four package legs and a socket of the present invention is an LED package socket and package legs structure, includes: a socket, wherein the socket with round-shape parabola surface side wall. Which is to be the die bonding seat for bonding the die on the bottom of the socket, around the socket is the common negative bonding pad, and extends to the right to be a first package leg; a first LED positive bonding pad extends to the right to be a second package leg and parallel to the first package leg; a second LED positive bonding pad extends to the left and oppose to the first package leg in a line, to be a third package leg; a third LED positive bonding pad extends to the left, parallel to the third package leg and oppose to the second package leg in a line, to be a fourth package leg; said common negative bonding pad and the other three positive bonding pads seat on the four corners of a square; multiple small tie bars and large tie bars on the end of the package legs connect the package legs together so that it is convenience to handle; The large tie bars has transportation gear hole for automation transport, the tie bar will cut away after packaging; said die bonding seat on the socket has round-shaped parabola side-wall, the rim of the socket stretches to the space within the square except the three positive bounding pad for heat dissipation, said positive bounding pads are square or round-shape.

The manufacturing method of the three-primary-color overlap cascaded LED package includes the following steps: (a) first step, forming a tooling structure, comprising: a socket with round-shape parabola surface side-wall, to be a die bonding seat, around the socket is the common negative bonding pad, and extends to the right to be a first package leg; a first LED positive bonding pad extends to the right to be a second package leg and parallel to the first package leg; a second LED positive bonding pad extends to the left and oppose to the first package leg in a line, to be a third package leg; a third LED positive bonding pad extends to the left, parallel to the third package leg and oppose to the second package leg in a line, to be a fourth package leg; said common negative bonding pad and the other three positive bonding pads seat on the four corners of a square; multiple small tie bars and large tie bars on the end of the package legs connect the package legs together; The large tie bars has transportation gear holes for automatic transport, said die bonding seat on the socket has round-shaped parabola side-wall, the rim of the socket stretches to the space within the square except the three positive bounding pad, said positive bounding pads are square or round-shape; (b) second step, a metal plate is punched by using said tooling and a punch machine to form said common negative bonding pad and package legs; (c) third step, the common negative bonding pad is punched by using another tooling to form a socket with round-shape parabola surface side-wall to be the die bonding seat; (d) fourth step, the four package legs is bended from the edge of the bonding pads downward 90° so that the die bonding seat is upward and the legs are downward; (e) fifth step, the three-primary-color overlap cascaded LED die is die-bonded on the die bonding seat; (f) sixth step, the negative and positive pad of the die is wire bonded to the common negative and the positive bonding pads respectively; (g) seventh step, cut the structure to single structures; (h) eighth step, seal the package with transparent epoxy molding; (i) ninth step, cut away the small an large tie bars. However, the seventh step may be done after the eighth step is completed, and the first and second steps can be formed by etching or plating method. The present invention can be used in surface mount technology by bending the end of the four legs inward or outward after transparent epoxy molding, so that the PC board need not via hole drilling and plating, the packaging process steps is then simplified.

DETAIL DESCRIPTION OF THE PRESENT INVENTION

Referred embodiments of the present invention will be explained with refer to the accompanying drawings, The socket and package legs of the package structure and the manufacturing method uses four legs as an example, but it is not limited to four legs, more legs may be used.

Figure 1:
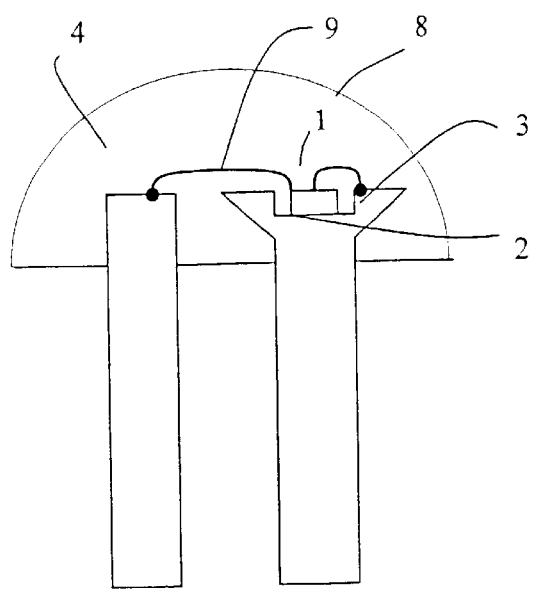
FIG. 1 (prior art) shows the cross section of a mono-color LED with two package legs.
Figure 2:
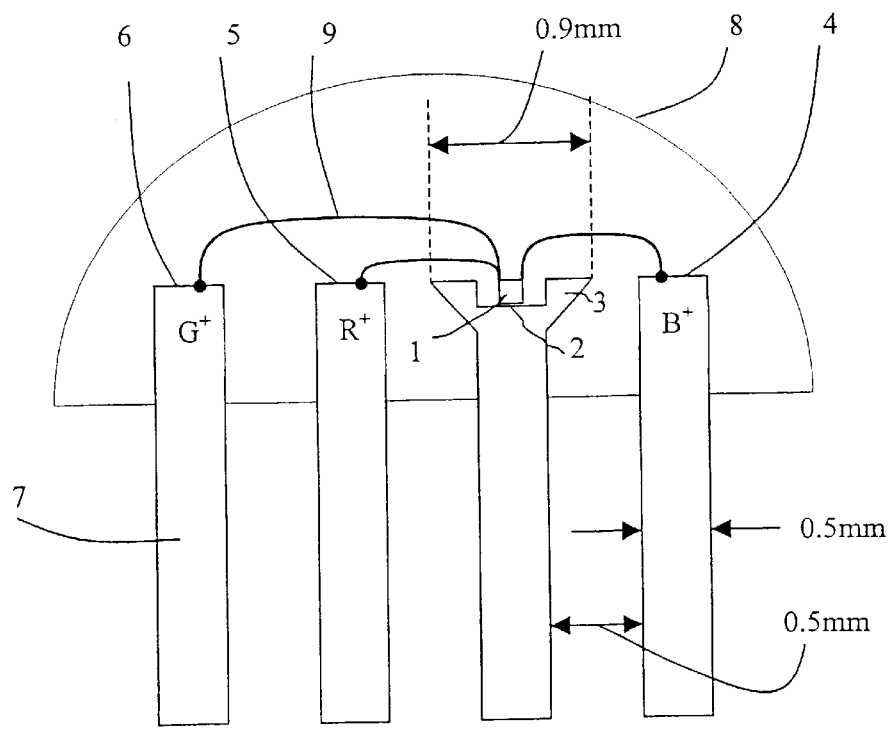
FIG. 2 (prior art) shows the cross section of a three-primary-color white light LED package structure.
Figure 3:
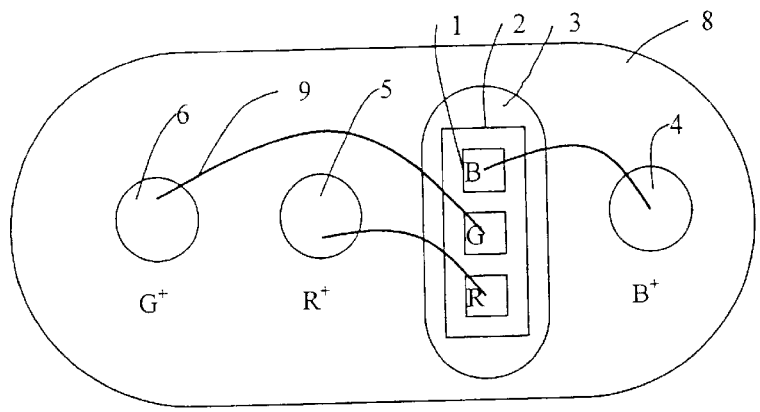
FIG. 3 (prior art) shows the top view of a three-primary-color white light LED package structure.
Figure 4:
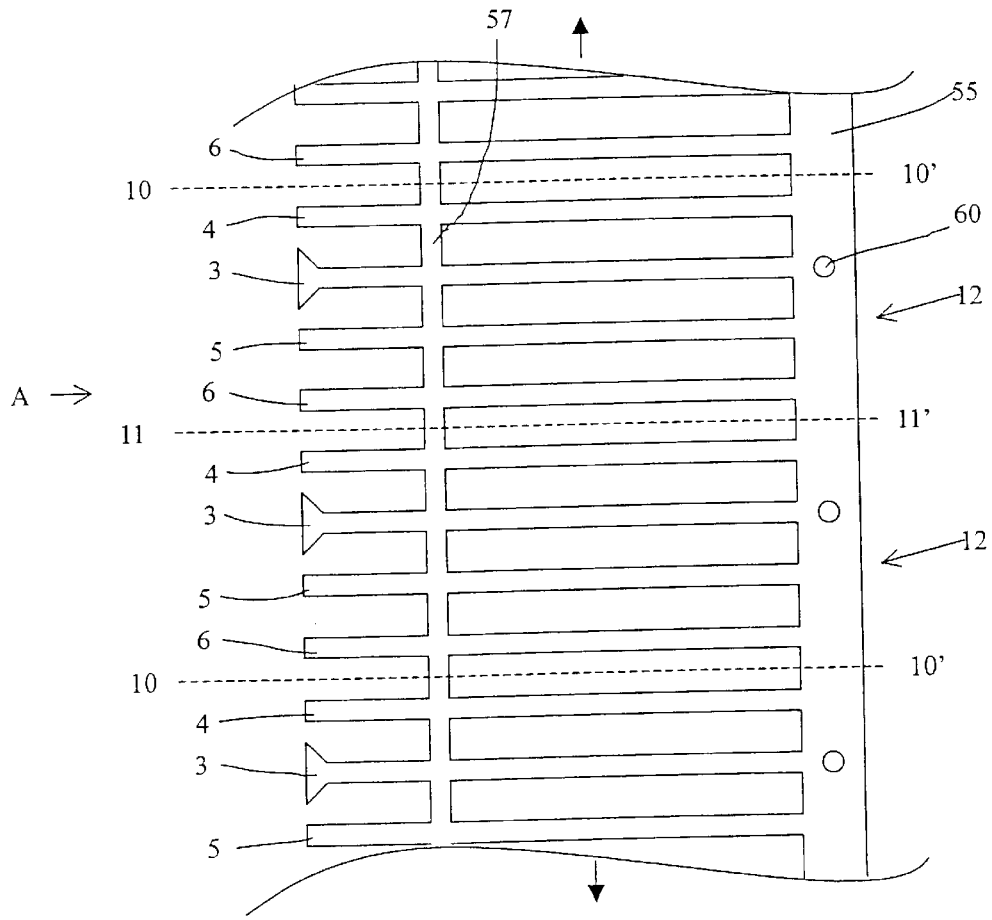
FIG. 4 (prior art) is a top view of an LED package structure with four legs and a socket punched by a metal tooling and punch machine on a metal plate.
Figure 5:
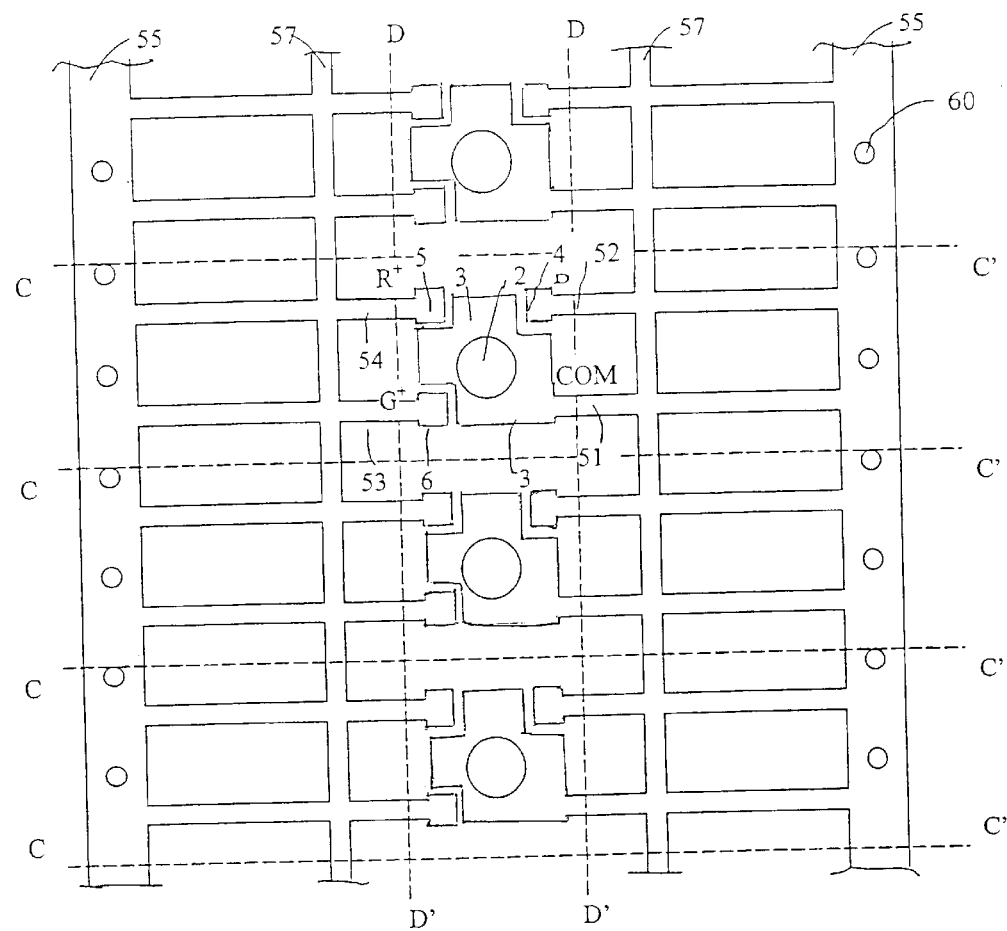
FIG. 5 is a top view of an LED package structure with four legs and a socket punched by a metal tooling and punch machine on a metal plate of the present invention.
Figure 6:
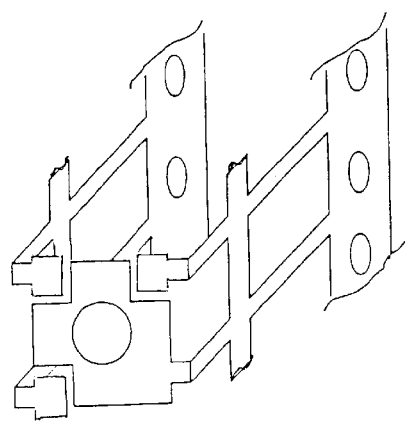
FIG. 6 is a perspective view of an LED package structure with four package legs and a socket after separated and bended the four led by 90°.
Figure 7:
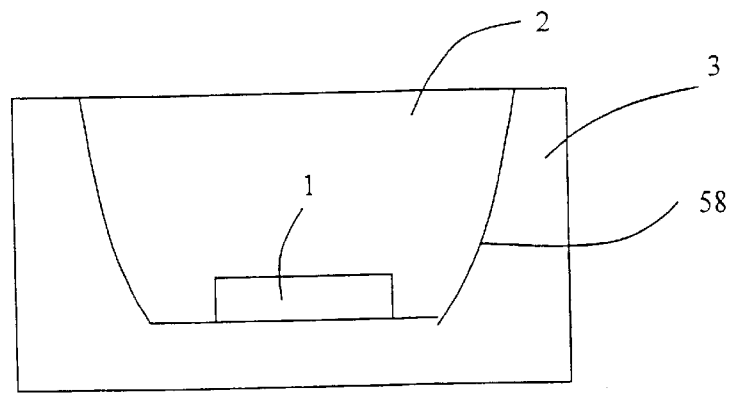
FIG. 7 shows the cross section view of socket has round-shape parabola side-wall and a die bounding seat.
Figure 8:
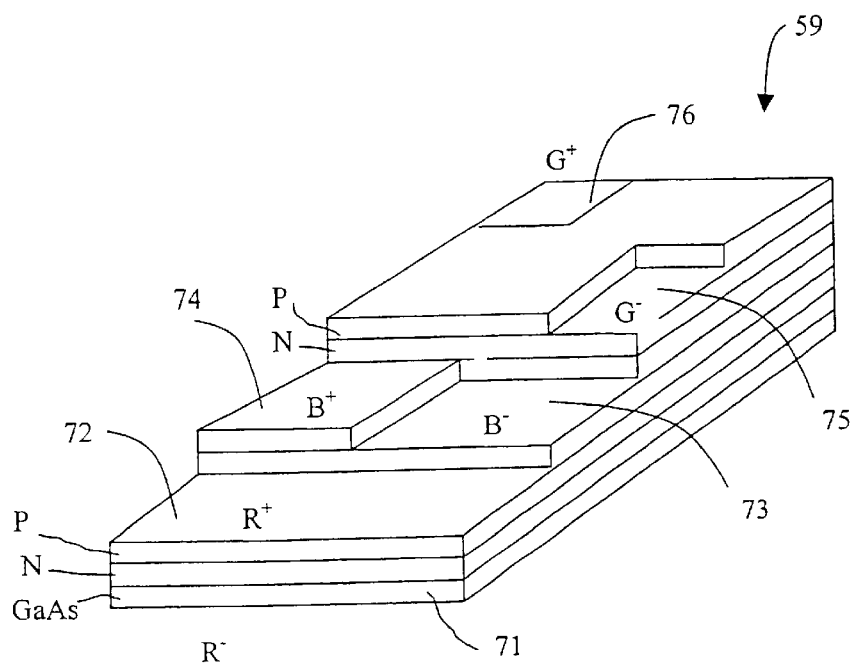
FIG. 8 is a drawing showing an enlarged view of a three-primary-color overlap cascaded LED structure.
Figure 9:
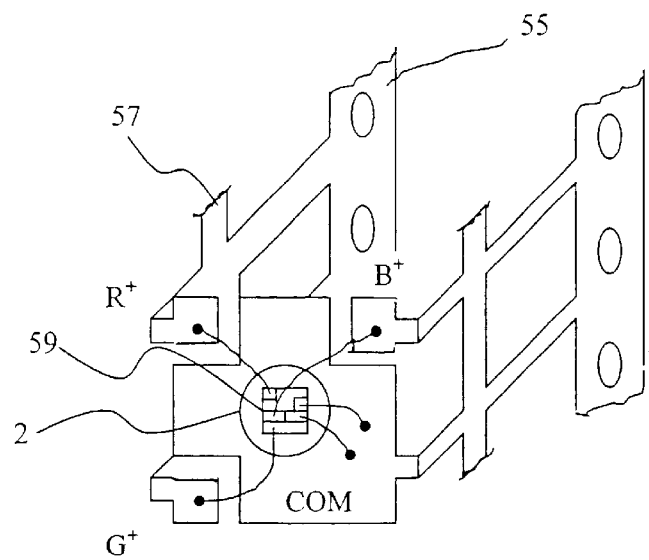
FIG. 9 is a perspective view of an LED package structure with four package legs and a socket after die bond and wire bond of the LED chip.

FIG. 5 is a top view of an LED package structure with four legs and a socket punched by a metal tooling and punch machine on a metal plate of the present invention. The end of the first package leg 51 formed a socket and a common negative bonding pad 3, wherein a socket form the die bonding seat 2 for die bonding of the three-primary-overlay-cascaded LED, the die bonding seat 2 is a socket with round-shape parabola surface side-wall which reflect and focus the light then emit forward to increase the intensity One end of the second, third and fourth package leg 52,53 and 54 forms the blue, red and green LED positive bonding pad 4,5 and 6; the first and second package legs 51 and 52 extend to one side, the third and fourth package legs 51 and 52 extend to the other side. Four bonding-pads and legs form a set, many sets form an array, the array is connected the legs together by small tie bars 57 near the bonding-pads and by large tie bars 55 near the end of the legs for automatic manufacturing, the large tie bars has transportation gear holes 60 for automatic transport. The structure is formed by punching a metal plate using a tooling, the bonding-pads and the legs is punched first, then punch the socket with round-shape parabola surface side-wall to form the die bonding seat 2, as shown in FIG. 5. The legs are then bending 90° along line D–D' after punched, as shown in FIG. 6. Then die-bond and wire-bond are processed automatically. The packages are then cut along line C–C', as shown in FIG. 9. Then seal with transparent epoxy (not shown) and cut away the small tie bars 57 and large tie bars 55. Since each side of the package has only two legs, it has enough space, for example, the width of each package leg is 0.5 mm, and the space between two legs has enough space and need not limited to 0.5 mm as the convention packages. The minimum area of the four legs is then $(0.5 \text{ mm} + 0.5 \text{ mm})^2 = 1 \text{ mm}^2$ or larger. Because the bonding pads are on the four corners of the die, bonding wire can be shorter to increase reliability. Also by increase the width and space of the legs, hole drilling is more easy and plating into the hole is more uniform and forms better contacts, so that increase the yield of PC board and its reliability. Because the four legs seat on the four corners of a square, the LED package can stand alone and is more easy to work on a PC board. This is one of the advantages of the present invention.

According to the second embodiment of the present invention, after punched a metal plate and form the structure as shown in FIG. 5, die-bond and wire-bond are performed first and then bend the legs 90° along line D–D', then completed sealing with transparent epoxy (not shown) and cut away the small tie bars 57 and large tie bars 55, so automatic manufacturing can be used for mass production. This is one of the advantages of the present invention.

Figure 10:
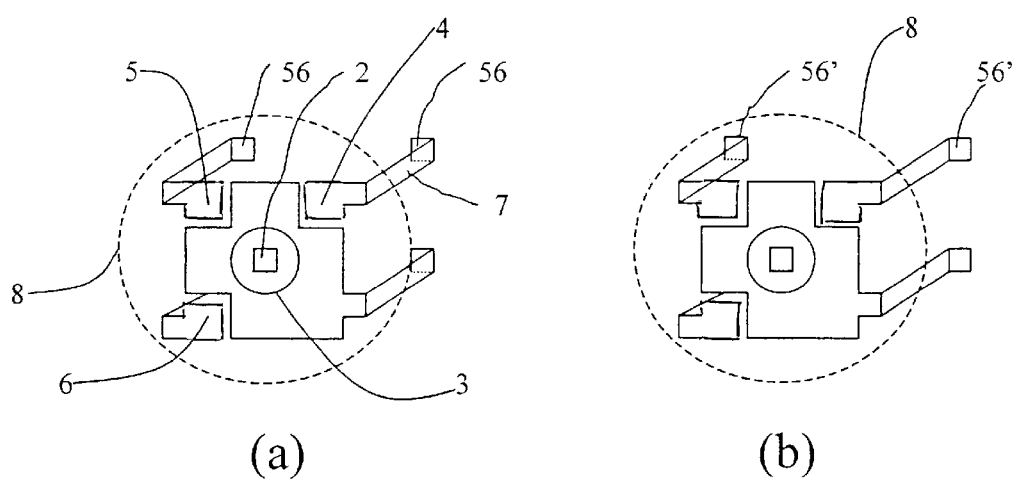
FIG. 10 (a) and (b) is a perspective view of an LED package structure with four package legs and a socket used in surface mound technology (a) with the end of the four legs bending inside; (b) bending outside.

According to the third embodiment of the present invention, as shown in FIG. 10, after completed sealing with transparent epoxy 8 and cut away the small tie bars 57 and large tie bars 55, by bending the end of the four legs inward or outward so that the package can be used in surface mount technology on a PC board, the PC board need not drilling holes and plating in the holes to eliminate packaging steps, and is more easy to make LED array on a PC board. This is one of the advantages of the present invention.

The embodiments mentioned above are only examples for explaining the present invention. Any similar products modified according to this disclosure such as using three or more package legs, or by using etching or plating method instead of punching, should be regarded within the scope of the present invention.

What is claimed is:

1. A three-primary-color LED package structure, with four package legs and a socket is an LED package socket and package leg structure, comprising:
    a socket, wherein the socket with round-shape parabola surface side wall, to be the die bonding seat, around the socket is the common negative bonding pad, and extends to the right to be a first package leg;
    a first LED positive bonding pad extends to the right to be a second package leg and parallel to the first package leg;
    a second LED positive bonding pad extends to the left and oppose to the first package leg in a line, to be a third package leg;
    a third LED positive bonding pad extends to the left, parallel to the third package leg and oppose to the second package leg in a line, to be a fourth package leg;
    the common negative bonding pad and other three positive bonding pads seat on the four corners of a square; and
    plurality of small tie bar near the bonding pads and large tie bar on the end of the package legs connect the package legs together, the large tie bars has transportation gear holes.

2. The three-primary-color LED package structure according to claim 1, wherein the rim of the socket stretches to the space within the square except the three positive bounding pads.

3. The three-primary-color LED package structure according to claim 1, wherein the positive bounding pads are square-shape.

4. The three-primary-color LED package structure according to claim 1, wherein the positive bounding pads are round-shape.

5. A manufacturing method of three-primary-color overlap cascaded LED package, includes the following steps:
    (a) first step, forming a tooling structure, comprising:
        a socket with round-shape parabola surface side-wall, to be a die bonding seat, around the socket is the common negative bonding pad, and extends to the right to be a first package leg;
        a first LED positive bonding pad extends to the right to be a second package leg and parallel to the first package leg;
        a second LED positive bonding pad extends to the left and oppose to the first package leg in a line, to be a third package leg;
        a third LED positive bonding pad extends to the left, parallel to the third package leg and oppose to the second package leg in a line, to be a fourth package leg;
        the common negative bonding pad and the other three positive bonding pads seat on the four corners of a square; plurality of small tie bar near the bonding pads and large tie bar on the end of the package legs connect the package legs together; said large tie bars has transportation gear holes;
        plurality of said structures connected by small and large tie bars in a row;
    (b) second step, a metal plate is punched by using said tooling and a punch machine to form said common negative bonding pad and package legs;
    (c) third step, the common negative bonding pad is punched by using another tooling to form a socket with round-shape parabola surface side-wall to be the die bonding seat;
    (d) fourth step, the four package legs is bended from the edge of the bonding pads downward 90° so that the die bonding seat is upward and the legs are downward;
    (e) fifth step, the three-primary=color overlap cascaded LED die is die-bonded on the die bonding seat;
    (f) sixth step, the negative and positive pad of the die is wire bonded to the common negative and the positive bonding pad respectively;
    (g) seventh step, cut the structure to single structures;
    (h) eighth step, seal the package with transparent epoxy molding;
    (i) ninth step, cut away the small an large tie bars.

6. The manufacturing method according to claim 5, wherein the seventh step is done after the eighth step is completed.

7. The manufacturing method according to claim 5, wherein the first step is form by etching method.

8. The manufacturing method according to claim 5, wherein the first step is form by plating method.

9. The manufacturing method according to claim 5, wherein the end of the four legs is bended inward after transparent epoxy molding for surface mount package.

10. The manufacturing method according to claim 5, wherein the end of the four legs is bended outward after transparent epoxy molding for surface mount package.

* * * * *